（12） United States Patent
Taniguchi et al.

(10) Patent No.: US 11,349,524 B2
(45) Date of Patent: May 31, 2022

(54) SYMBOL-DETERMINING DEVICE AND SYMBOL DETERMINATION METHOD

(71) Applicant: NIPPON TELEGRAPH AND TELEPHONE CORPORATION, Tokyo (JP)

(72) Inventors: Hiroki Taniguchi, Yokosuka (JP); Shuto Yamamoto, Yokosuka (JP); Akira Masuda, Yokosuka (JP); Mitsunori Fukutoku, Yokosuka (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 57 days.

(21) Appl. No.: 16/959,582

(22) PCT Filed: Jan. 18, 2019

(86) PCT No.: PCT/JP2019/001474
§ 371 (c)(1),
(2) Date: Jul. 1, 2020

(87) PCT Pub. No.: WO2019/142912
PCT Pub. Date: Jul. 25, 2019

(65) Prior Publication Data
US 2020/0389207 A1    Dec. 10, 2020

(30) Foreign Application Priority Data

Jan. 19, 2018  (JP) .............................. JP2018-007671

(51) Int. Cl.
*H04B 10/69*    (2013.01)
*H04B 3/06*     (2006.01)
*H04L 1/00*     (2006.01)

(52) U.S. Cl.
CPC .............. *H04B 3/06* (2013.01); *H04B 10/697* (2013.01); *H04L 1/0054* (2013.01)

(58) Field of Classification Search
CPC ........................................... H04B 10/69–6973
See application file for complete search history.

(56) References Cited

U.S. PATENT DOCUMENTS 5,272,727 A    12/1993  Okanoue
5,602,507 A     2/1997  Suzuki
(Continued)

FOREIGN PATENT DOCUMENTS

JP    H04-351136 A    12/1992
JP    H10-173573 A     6/1998
WO    WO-95-12926 A1   5/1995

OTHER PUBLICATIONS

Nicklas Eiselt, Sjoerd van der Heide, Helmut Griesser, Michael Eiselt, Chigo Okonkwo, Juan Jose Vegas Olmos and Idelfonso Tafur Monroy, "Experimental Demonstration of 112-GBit/s PAM-4 over up to 80 km SSMF at 1550 nm for Inter-DCI Applications", ECOC2016, 42nd European Conference and Exhibition on Optical Communications, Sep. 18-22, 2016 Dusseldorf.
(Continued)

*Primary Examiner* — Nathan M Cors
(74) *Attorney, Agent, or Firm* — Harness, Dickey & Pierce, P.L.C.

(57) ABSTRACT

A symbol-determining device according to an embodiment includes: a transmission line shortening unit that multiplies each symbol value of a symbol array that is part of an input signal by a tap gain of a linear digital filter and outputs a symbol array representing a sum of values acquired through the multiplication; a transmission line estimating unit that estimates a transfer function of a transmission line using an adaptive nonlinear digital filter on the basis of a symbol array representing a state of the transmission line; an addi-
(Continued)

tion comparison processing unit that calculates a minimum value of a distance function in a Viterbi algorithm on the basis of a metric that is calculated on the basis of the output of the transmission line shortening unit and the transfer function; and a path tracing-back determination unit that performs symbol determination by tracing back a trellis path in the Viterbi algorithm on the basis of the minimum value of the distance function.

10 Claims, 12 Drawing Sheets

(56) References Cited

U.S. PATENT DOCUMENTS

| | | | |
|---|---|---|---|
| 2011/0211842 A1* | 9/2011 | Agazzi | H04L 25/0202 398/141 |
| 2016/0197680 A1* | 7/2016 | Li | H04B 10/6972 398/194 |
| 2020/0036440 A1* | 1/2020 | Yamagishi | H04B 10/40 |

OTHER PUBLICATIONS

D. D. Falconer and F. R. Mage, Jr., "Adaptive Channel Memory Truncation for Maximum Likelihood Sequence Estimation", The Bell System Technical Journal, vol. 52, No. 9, Nov. 1973, pp. 1541-1562.

Xianming Zhu, Shiva Kumar, Srikanth Raghavan and Yihong Mauro, "Application of Nonlinear MLSE Based on Volterra Theory in NZ-DSF Optical Communication Systems", in 2008 Conference on Lasers and Electro-Optics, 2008, vol. 2, pp. 1-2.

Kawahara, Hiroki et al., "Proposal of Inter-channel Nonlinearity Compensation Using Combined Techniques of Optical Compensation and Adaptive Volterra Filter", Proceedings of the IEICE general conference, Mar. 2016, p. 357.

Sjoerd van der Heide et al., "Experimental Investigation of Impulse Response Shortening for Low-Complexity MLSE of a 112-Gbit/s PAM-4 Transceiver", ECOC 2016, VDE, Sep. 2016, pp. 115-117.

Taniguchi Hiroki et al., "MLSE based on nonlinear equalizer to improve bandwidth-limitation tolerance for short-reach optical transmission", Proceedings of the IEICE general conference, Mar. 2018, p. 222.

International Search Report (In English and Japanese) issued in PCT/JP2019/001474, dated Apr. 2, 2019.

\* cited by examiner

SYMBOL-DETERMINING DEVICE AND SYMBOL DETERMINATION METHOD

CROSS-REFERENCE TO RELATED APPLICATIONS

This application is a 371 National Stage of International Application No. PCT/JP2019/001474, filed on Jan. 18, 2019, which claims priority to Japanese Application No. 2018-007671, filed on Jan. 19, 2018. The entire disclosures of the above applications are incorporated herein by reference.

TECHNICAL FIELD

The present invention relates to a symbol-determining device and a symbol determination method.

BACKGROUND ART

In accordance with the rapid spread of smartphones and tablets and an increase in rich contents such as high-definition moving image delivery services and the like in recent years, traffic transmission through a backbone network such as the Internet is continuously increasing. In addition, as the utilization of cloud services advances in companies, network traffic between DCs and inside data centers (DCs) is also predicted to increase at a rate of about 1.3 times per year likewise. Currently, in a connection system inside a DC or between DCs, Ethernet (a registered trademark; hereinafter the same) has been mainly introduced. In accordance with an increase in communication traffic, it is predicted that it will become difficult to realize a large scale DC at a single base, and accordingly, in the future, the necessity for linking DCs will become greater than until now, and traffic interchanged between DCs is expected to further increase. In order to respond to such situations, a technology for short-distance optical transmission with a large capacity with low cost is required to be established.

In the current Ethernet specification, optical fiber communication is applied to a transmission line up to 40 km except for 10 GBE-ZR, and an intensity modulation system in which binary information is assigned to on/off of light is used up to 100 GBE. A reception side is configured using only an optical receiver and has a lower cost configuration than that of a coherent reception system used for long-distance transmission (FIG. 12). By performing four-wave multiplexing of a non-return-to-zero (NRZ) signal of which a modulation speed is 25 GBd, and the amount of information per symbol is 1 bit/symbol, a transmission capacity of 100 Gb/s is realized.

In the standardization of 400 GbE corresponding to the next generation of 100 GbE, for the first time, PAM4 (4-level pulse-amplitude-modulation) of 2 bits/symbol is employed in consideration of maintenance of an economical device configuration used in 100 GbE and band utilization efficiency of signals.

For additional traffic increase in the future, standardization of 800 GbE and 1.6 TbE is planned after the year 2020, and an increase in the capacity from the current 400 GbE has been reviewed.

As a problem with respect to a further increase in capacity, there is deterioration in a signal quality accompanying an increase in transmission capacity.

More specifically, there is inter-code interference due to band limitation accompanying an increase in the speed of a system configuration using a low-cost device, in other words, a narrow-band device. As the most-effective equalization system for acquiring correct transmission data from a reception signal waveform distorted in accordance with inter-code interference, maximum likelihood sequential estimation (MLSE) is known (Non-Patent Literature 1). A signal quality deterioration inhibiting technology using MLSE has been reviewed also for an increase in capacity of the Ethernet described above (for example, see Non-Patent Literature 1). MLSE estimates and reproduces an inter-code interference received by a transmission signal waveform using digital signal processing of the receiver side, whereby high equalization performance is realized. Therefore, when the estimation accuracy becomes high, code errors due to inter-code interference can be inhibited.

In addition, in the implementation of MLSE, a complete maximum likelihood sequence can be acquired with a small amount of calculation using a Viterbi algorithm. This is an algorithm for reducing the amount of calculation that exponentially increases with respect to a sequence length to a linear increase.

CITATION LIST

[Non-Patent Literature 1]
Nicklas Eiselt, Sjoerd van der Heide, Helmut Griesser, Michael Eiselt, Chigo Okonkwo, Juan Jose Vegas Olmos and Idelfonso Tafur Monroy "Experimental Demonstration of 112-GBit/s PAM-4 over up to 80 km SSMF at 1550 nm forinter-DCI Applications" ECOC2016, 42nd European Conference and Exhibition on Optical Communications Sep. 18-22, 2016 Dusseldolf
[Non-Patent Literature 2]
D. D. FALCONER and F. R. MAGEE. JR. "Adaptive Channel Memory Truncation for Maximum Likelihood Sequence Estimation" The Bell System Technical Journal Vol. 52, No. 9, pp. 1541-1562, November, 1973
[Non-Patent Literature 3]
Xianming Zhu, Shiva Kumar, Srikanth Raghavan and Yihong Mauro "Application of Nonlinerar MLSE Based on Volterra Theory in NZ-DSF Optical Communication Systems" in 2008 Conference on Lasers and Electro-Optics, 2008, vol. 2, pp. 1-2

SUMMARY OF INVENTION

Technical Problem

Nevertheless, still, (1) the amount of calculation exponentially increases with respect to a pulse expansion width, and (2) MLSE needs to estimate response characteristics of a transmission line, and, in an optical transmission system premised on a direct wave detection system, there remains a problem in that there is a limit on the estimation accuracy in MLSE due to non-linearity of square-law detection. For such problems, there are approaches including (1) By compressing an impulse response of a signal pulse by installing a feed forward equalizer (a transmission line shortening unit) at a stage prior to MLSE, inhibiting increase in the amount of calculation depending on a storage length of the MLSE (Non-Patent Literature 2) and (2) enhancing the estimation accuracy by applying a nonlinear filter to the MLSE (Non-Patent Literature 3).

In consideration of the situations described above, the present invention is a signal quality deterioration inhibiting technology in digital signal processing in a reception side of a low-cost optical transmission system, and an object thereof is to provide a symbol-determining device and a symbol determination method performing symbol determination using MLSE solving the remaining problems described above in accordance with a technique utilizing characteristics of optical transmission.

Solution to Problem

According to one aspect of the present invention, a symbol-determining device includes: a transmission line shortening unit that acquires part of an input signal formed from a symbol array propagating through a transmission line, for each symbol of the acquired symbol array, calculates a value acquired by multiplying a value represented by the symbol by a tap gain of a linear digital filter, calculates a sum of values acquired through the multiplication, and outputs a symbol array representing the sum; a transmission line estimating unit that includes an adaptive nonlinear digital filter and estimates a transfer function of the transmission line using the adaptive nonlinear digital filter on the basis of a symbol array representing a state of the transmission line; an addition comparison processing unit that calculates a minimum value of a distance function in a Viterbi algorithm on the basis of a metric that is a value calculated on the basis of the output of the transmission line shortening unit and the transfer function estimated by the transmission line estimating unit; and a path tracing-back determination unit that performs symbol determination by tracing back a trellis path in the Viterbi algorithm on the basis of the minimum value of the distance function and outputs a symbol array that is a result of the determination.

One aspect of the present invention is the symbol-determining device described above, further including a filter updating unit that updates a value of the tap gain on the basis of the symbol array representing the sum output by the transmission line shortening unit and the symbol array output by the path tracing-back determination unit.

According to one aspect of the present invention, in the symbol-determining device described above, the adaptive nonlinear digital filter included in the transmission line estimating unit is a Volterra filter of an n-th order (here, n is an integer equal to or larger than two).

According to one aspect of the present invention, in the symbol-determining device described above, the filter updating unit updates a value of a Volterra kernel on the basis of the value of the Volterra kernel of the transmission line estimating unit and the symbol array output by the path tracing-back determination unit.

According to one aspect of the present invention, in the symbol-determining device described above, the value of the tap gain and the value of the Volterra kernel of the Volterra filter are acquired through training performed in advance.

One aspect of the present invention is the symbol-determining device described above, further including a second transmission line estimating unit that includes the adaptive nonlinear digital filter and calculates a value used for updating the value of the Volterra kernel of the first transmission line estimating unit, and the value of the tap gain and the value of the Volterra kernel are updated on the basis of a difference between the symbol array representing the sum in a case in which a training information symbol array generated on the basis of a known information bit row propagates as a transmission signal, and the symbol array acquired by the transmission line shortening unit is input and the output of the second transmission line estimating unit in a case in which the training information symbol array is input.

According to one aspect of the present invention, in the symbol-determining device described above, the filter updating unit determines whether or not the tap gain of the linear digital filter is to be updated by performing comparison with a predetermined value by referring to the value of the distance function.

According to one aspect of the present invention, in the symbol-determining device described above, the filter updating unit determines whether or not the value of the Volterra kernel is to be updated by performing comparison with a predetermined value by referring to the value of the distance function.

According to one aspect of the present invention, in the symbol-determining device described above, the addition comparison processing unit calculates the minimum value of the distance function using a Viterbi algorithm, and the determination unit performs symbol determination by tracing back a trellis path in the Viterbi algorithm.

One aspect of the present invention is a symbol determination method including: a transmission line shortening step of acquiring part of an input signal formed from a symbol array propagating through a transmission line, for each symbol of the acquired symbol array, calculating a value acquired by multiplying a value represented by the symbol by a tap gain of a linear digital filter, calculating a sum of values acquired through the multiplication, and outputting a symbol array representing the sum; a first transmission line estimating step of including an adaptive nonlinear digital filter and estimating a transfer function of the transmission line using the adaptive nonlinear digital filter on the basis of a symbol array representing a state of the transmission line; an addition comparison processing step of calculating a minimum value of a distance function on the basis of a metric that is a value calculated on the basis of the output in the transmission line shortening step and the transfer function estimated in the first transmission line estimating step; and a determination step of performing symbol determination on the basis of the minimum value of the distance function and outputting a symbol array that is a result of the determination.

Advantageous Effects of Invention

According to the present invention, a symbol determination method using MLSE inhibiting an increase in the amount of calculation can be provided.

DESCRIPTION OF EMBODIMENTS

First Embodiment

Figure 1:
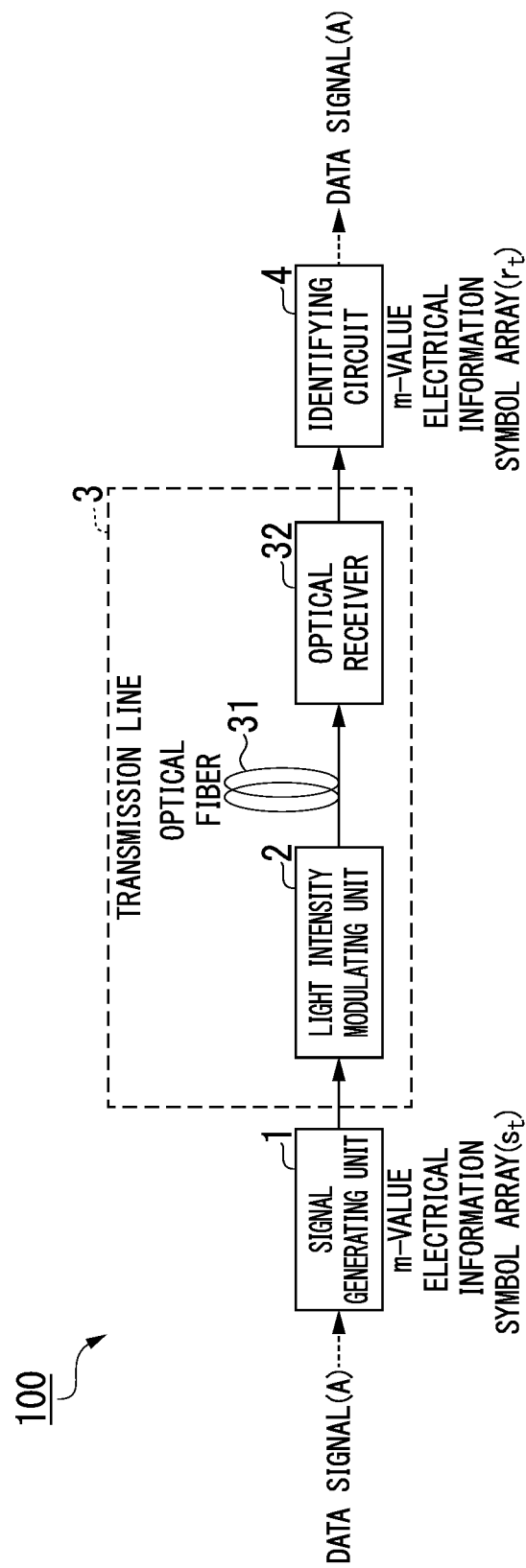
FIG. 1 is a diagram illustrating a specific system configuration of a communication system 100 according to a first embodiment.

FIG. 1 is a diagram illustrating a specific system configuration of a communication system 100 according to a first embodiment. The communication system 100 is an optical transmission system that transmits information represented by a symbol array.

The communication system 100 includes a signal generating unit 1, a light intensity modulating unit 2, a transmission line 3, and an identifying circuit 4 (a symbol-determining device).

The signal generating unit 1 generates an electrical information symbol array of m values (hereinafter, referred to as an "an m-value electrical information symbol array") $\{s_t\}$ from an input data signal. The m-value electrical information symbol array represents m-ary codes. One symbol of the m-value electrical information symbol array represents m kinds of signs (or numbers) according to the magnitude of a voltage or a current. Here, m is an integer that is equal to or larger than 2 and is a degree of multiple values of a symbol. When m kinds of signs (or numbers) are represented as numbers, the m kinds of signs (or numbers) are 0, 1, ..., (m−1).

The subscript t (here, t is an integer equal or larger than 0) is an identifier used for identifying each symbol and represents a time at which each symbol of the m-value electrical information symbol array $\{s_t\}$ is generated.

The transmission line 3 converts the m-value electrical information symbol array $\{s_t\}$ into an m-value optical information symbol array and transmits the converted m-value optical information symbol array and converts the m-value optical information symbol array into an m-value electrical information symbol array $\{r_t\}$ representing m kinds of signs (or numbers) according to the magnitudes of voltages or currents again and outputs the m-value electrical information symbol array $\{r_t\}$. The transmission line 3 includes a light intensity modulating unit 2, an optical fiber 31, and an optical receiver 32. The light intensity modulating unit 2 acquires an m-value electrical information symbol array $\{s_t\}$ and generates an m-value optical information symbol array that is a symbol array representing m kinds of signs (or numbers) according to light intensities. Hereinafter, a transfer function of the transmission line 3 will be denoted by H.

The transfer function H is a function that is estimated by the identifying circuit 4 according to an embodiment to be described below.

Figure 2:
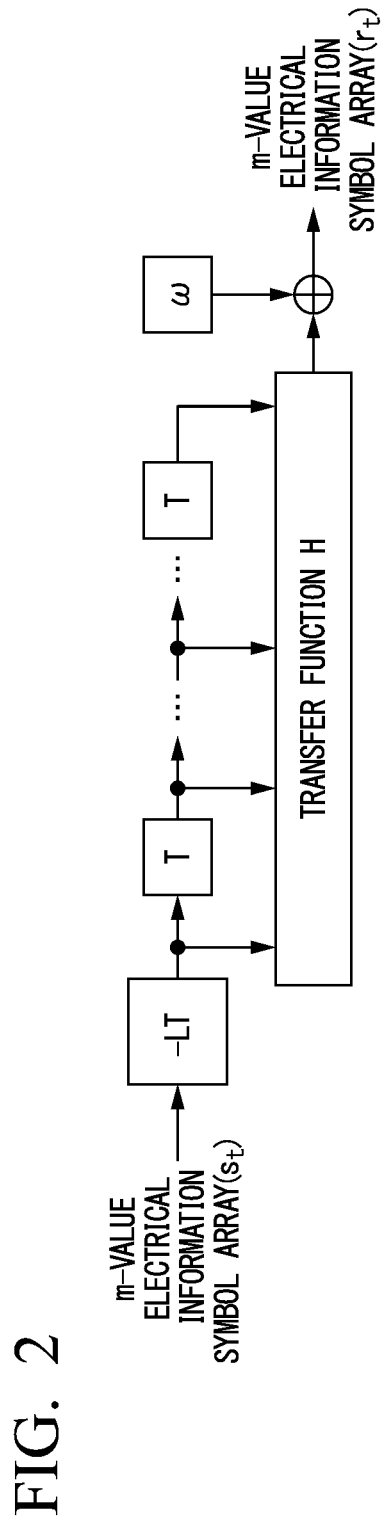
FIG. 2 is a diagram illustrating a specific equivalent circuit of a transmission line 3 according to the first embodiment.

FIG. 2 is a diagram illustrating a specific equivalent circuit of the transmission line 3 according to the first embodiment. In FIG. 2, T is a symbol interval and is a time interval of calculation times in the communication system 100. The symbol interval is a time from when a symbol passes through a predetermined point until the next symbol passes the point. L represents the number of symbols. In a case in which inter-code interferences corresponding to L symbols before/after a symbol at a time t during transmission through the transmission line 3 are taken into account, the m-value electrical information symbol array $\{r_t\}$ output by the transmission line 3 is represented in the following equation. Hereinafter, a time t is an identifier of a discrete time according to the symbol interval T. In other words, tT is a time, and t represents a sequence of the time from a predetermined time in discrete times according to T.

[Math. 1]

$$r_t = H(s_{t-L}, \ldots, s_t, \ldots, s_{t+L}) + \omega_t \quad (1)$$

$\omega_t$ is a Gauss random sequence having an average of "0" and a dispersion $\delta 62$ and having elements independent from each other and is a noise component participating a symbol array according to the transmission line 3.

The optical fiber 31 transmits an m-value optical information symbol array. The optical receiver 32 receives an m-value optical information symbol array, converts the received m-value optical information symbol array into an m-value electrical information symbol array $\{r_t\}$ and outputs the m-value electrical information symbol array $\{r_t\}$. Any optical receiver 32 may be used as long as it converts an optical signal into an electrical signal. For example, the optical receiver 32 is a photodiode.

The identifying circuit 4 acquires a m-value electrical information symbol array $\{r_t\}$ and performs symbol determination of acquiring an estimated value of each symbol of the m-value electrical information symbol array $\{s_t\}$. The identifying circuit 4 estimates a transfer function H when the symbol determination is performed. Hereinafter, the estimated transfer function H will be referred to as an estimated transfer function H'.

Before description of a specific example of the functional configuration of the identifying circuit 4 according to the first embodiment, a conventional symbol determination method will be described.

Figure 3:
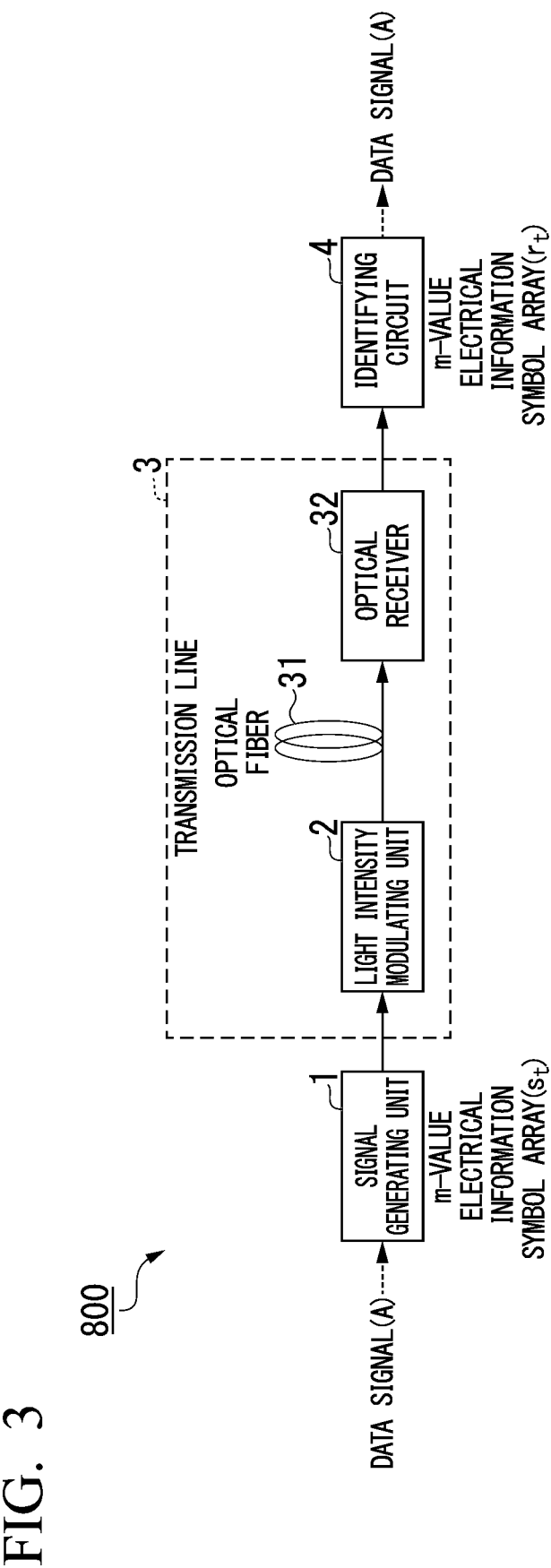
FIG. 3 is a diagram illustrating a specific system configuration of a conventional communication system 800.

FIG. 3 is a diagram illustrating a specific system configuration of a conventional communication system 800.

The communication system 800 includes an identifying circuit 8 instead of the identifying circuit 4 according to the first embodiment, which is different from the communication system 100. The identifying circuit 8 acquires an m-value electrical information symbol array $\{r_t\}$ and performs conventional symbol determination on the basis of the acquired m-value electrical information symbol array $\{r_t\}$. When conventional symbol determination is performed, similar to the identifying circuit 4, the identifying circuit 8 estimates a transfer function H.

The identifying circuit 8, for example, performs symbol determination using MLSE. MLSE is a method for performing symbol determination by searching for an m-value electrical information symbol array $\{s'_N\}$ of which a conditional joint probability density function $p_N(\{r_N\} \mid \{S'_N\})$ is a maximum. The conditional joint probability density function $p_N(\{r_N\} \mid \{S'_N\})$ is a probability of reception of an m-value electrical information symbol array $\{r_N\}$ in a case in which an m-value electrical information symbol array $\{s'_N\}$ having a sequence length N is transmitted through the transmission line 3. The conditional joint probability density function $p_N(\{r_N\} \{S'_N\})$ is represented in the following Equation. Here, the sequence length N is the number of symbols of an information symbol array.

[Math. 2]

$$p_N(\{r_N\} \mid \{s'_N\}) = \frac{1}{(2\pi\delta^2)^N} \exp\left[-\frac{1}{2\delta2^2}\sum_{t=1}^{N}|r_t - H(s'_{t-L}, \ldots, s'_t, \ldots, s'_{t+L})|^2\right] \quad (2)$$

Maximizing the conditional joint probability density function $p_N(\{r_N\} \{S'_N\})$ is equivalent to minimizing the distance function $d_N$. This distance function $d_N$ is a function represented using the following equation.

[Math. 3]

$$d_N = \sum_{t=1}^{N}|r_t - H(s'_{t-L}, \ldots, s'_t, \ldots, s'_{t+L})|^2 \quad (3)$$

Hereinafter, a method of minimizing the distance function $d_N$ will be described.

The number of states $\mu_t=(s'_{t-L}, \ldots, s'_t, \ldots, s'_{t+L})$ of the transmission line at a time t is $m^{2L+1}$. The number of states of the transmission line at a time t is an information symbol array transmitted through the transmission line at the time t. The number of states that may occur as the states of the transmission line at the time t is the number of all the combinations of 2L+1 symbol sequence length and modulation symbols I=[$i_1, i_2, \ldots, i_m$]. The symbol sequence length is the number of symbols of an information symbol array transmitted through the transmission line 3 at the time t. The modulation symbols are m kinds of signs (or numbers) represented by one symbol of the information symbol array transmitted through the transmission line 3. In other words, in a case in which the information symbol array is an octonary code, and eight kinds of signs (or numbers) are represented by numbers, modulation symbols are {0, 1, 2, 3, 4, 5, 6, 7}. Hereinafter, a state of a transmission line will be referred to as a transmission line state.

At a time t, the transmission line 3 having $m^{2L+1}$ states will be regarded as a finite state machine having $m^{2L+1}$ states. For this reason, the distance function $d_N$ can sequentially perform calculation according to a Viterbi algorithm every time when an m-value electrical signal sequence $\{r_N\}$ is received. A distance function $d_t(\{\mu_t\})$ for reaching a state μt at a time t can be represented using a distance function $d_{t-1}(\{\mu_{t-1}\})$ at a time t−1 and a likelihood (metric) $b(r_t; \mu_{t-1} \to \mu_t)$ accompanying a state transition at the time t. The distance function $d_t(\{\mu_t\})$ satisfies the following equation.

[Math. 4]

$$d_t(\{\mu_t\}) = d_{t-1}(\{\mu_{t-1}\}) + b(r_t; \mu_{t-1} \to \mu_t) \quad (4)$$

A metric b is represented using the following equation. In addition, H' is an estimated transfer function.

[Math. 5]

$$b(r_t; \mu_{t-1} \to \mu_t) = |r_t - H'(s'_{t-L}, \ldots, s'_t, \ldots, s'_{t+L})|^2 \quad (5)$$

The metric b at the time t depends only on a transition from a transmission line state at a time t−1 to a transmission line state at the time t and does not depend on a state before that.

In a case in which both $d\_min_{t-1}(\mu_{t-1})$ that is a minimum value of a distance function for reaching the transmission line state $\mu_{t-1}$ and a state transition, which corresponds thereto, to the transmission line state $\mu_t$ at the time t are known, in order to acquire a minimum value of the distance function $d_t(\mu_t)$ for which the transmission line state reaches a state $\mu_t$, distance functions $d_t(\mu_t)$ corresponding to all the state transitions do not need to be acquired. In such a case, a sum of $d\_min_{t-1}(\mu_{t-1})$ and $b(r_t;\mu_{t-1} \to \mu_t)$ may be calculated for all the transmission line states $\{\mu_{t-1}\}$ having possibilities of a transition to the transmission line state $\mu_t$, and a minimum value of the results may be further acquired. In other words, the following Equation (6) may be calculated.

[Math. 6]

$$d\_min_t(\mu_t) = \min_{\{\mu_{t-1}\} \mapsto \mu_t}\{d\_min_{t-1}(\mu_{t-1}) + b(r_t; \mu_{t-1} \to \mu_t)\} \quad (6)$$

$d\_min_t(\mu_t)$ is a minimum value of all the distance functions $d_t(\mu_t)$ or reaching the transmission line state $\mu_t$. Hereinafter, $d\_min_t(\mu_t)$ will be referred to as a minimum distance.

Figure 4:
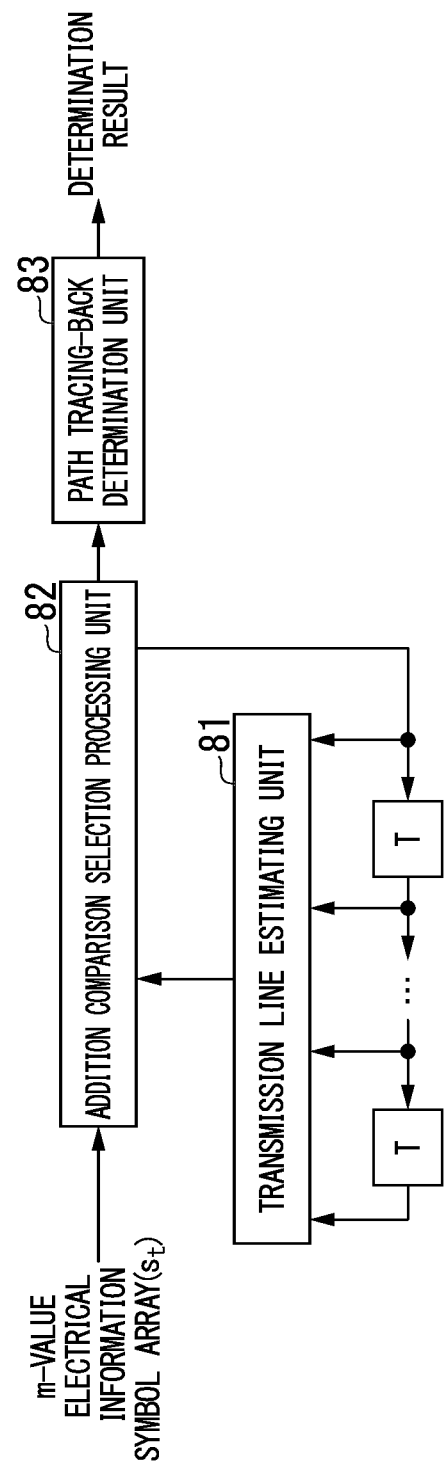
FIG. 4 is a diagram illustrating a specific example of the functional configuration of a conventional identifying circuit 8.

FIG. 4 is a diagram illustrating a specific example of the functional configuration of the conventional identifying circuit 8. The identifying circuit 8 includes a transmission line estimating unit 81, an addition comparison selection processing unit 82, and a path tracing-back determination unit 83

The transmission line estimating unit 81 estimates an estimated transfer function H'. The addition comparison selection processing unit 82 calculates a metric b and calculates a minimum distance $d\_min_t(\mu_t)$ on the basis of a result of the calculation. The path tracing-back determination unit 83 selects a state of a transmission line that becomes a start point of a trellis path of the Viterbi algorithm at which a distance function for reaching the transmission line state $\mu_t$ at the time t becomes $d\_min_t(\mu_t)$. The path tracing-back determination unit 83 acquires an estimated value of each symbol of the m-value electrical information symbol array $\{s_t\}$ on the basis of the selected transmission line state.

A specific example of the conventional method of symbol determination of MLSE and the functional configuration of the identifying circuit 8 executing the method has been described as above.

The description of the communication system 100 according to the first embodiment will be continued.

Figure 5:
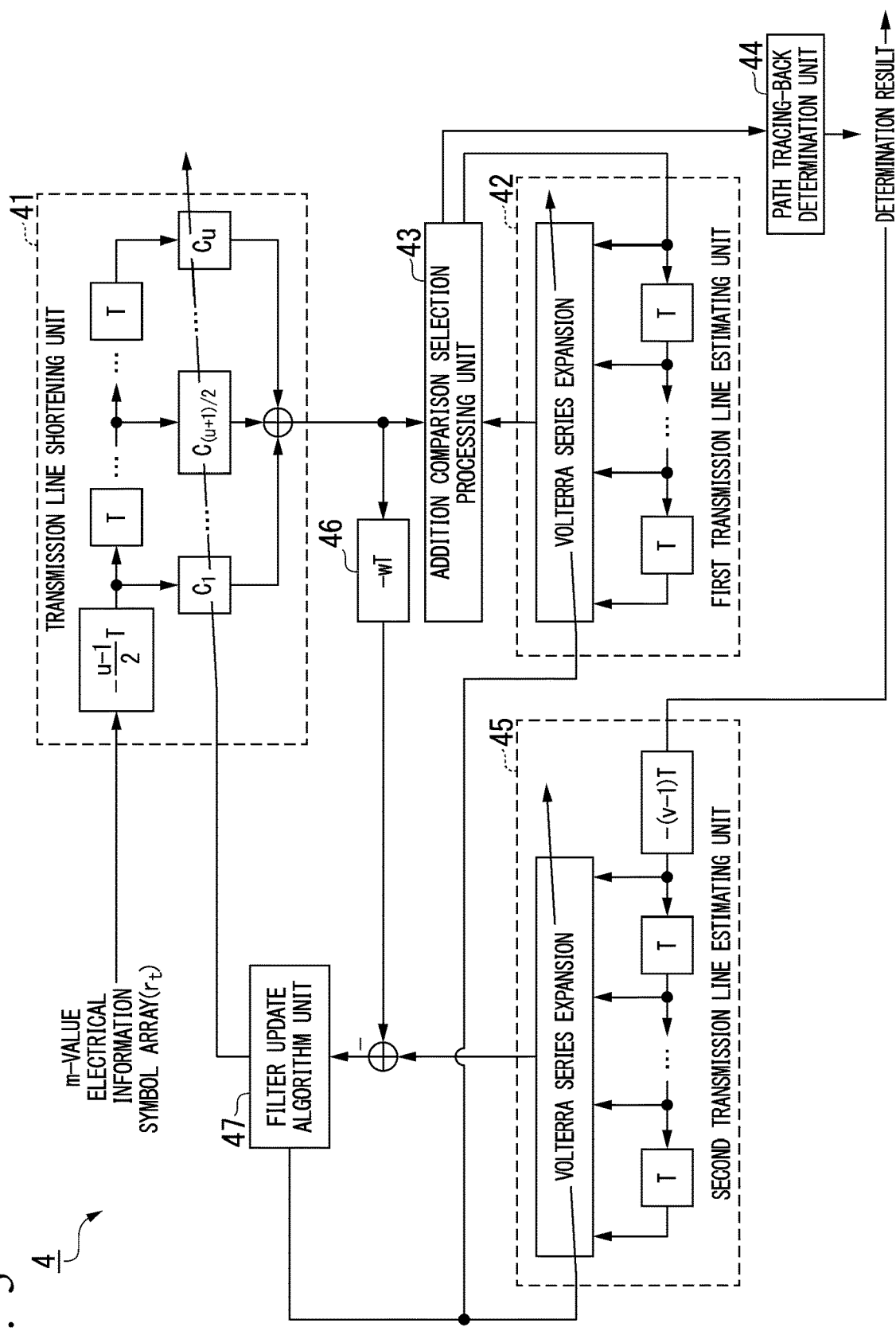
FIG. 5 is a diagram illustrating a specific example of the functional configuration of an identifying circuit 4 according to the first embodiment.

FIG. 5 is a diagram illustrating a specific example of the functional configuration of the identifying circuit 4 according to the first embodiment. The identifying circuit 4 includes a transmission line shortening unit 41, a first transmission line estimating unit 42, an addition comparison selection processing unit 43 (an addition comparison processing unit), a path tracing-back determination unit 44, a second transmission line estimating unit 45, a delay generating unit 46, and a filter update algorithm unit 47 (a filter updating unit).

The transmission line shortening unit 41 acquires part of an m-value electrical information symbol array $\{r_t\}$ output by the optical receiver 32 (hereinafter, referred to as a "partial symbol array") and performs a compression process. The transmission line shortening unit 41 outputs an information symbol array (hereinafter, referred to as a "compressed symbol array") OutA of which the amount of information of u m-value electrical information symbol arrays is compressed for one output symbol through the compression process. The compression process is a process of performing a product-sum operation for a partial symbol array $\{r_t\}$ and is a process of performing a product-sum operation represented using Equation (7).

More specifically, the transmission line shortening unit 41 delays a partial symbol array $\{r_t\}$ by a time $((u-1)/2)T$ and inputs u symbol arrays (in other words, a partial symbol array) having one symbol $r_{t(u+1)/2}$ of the partial symbol array $\{r_t\}$ as its center to an adaptive linear digital filter. Next, the transmission line shortening unit 41 multiplies a value represented by each symbol by a tap gain and outputs a symbol array (in other words, a compressed symbol array) representing a sum thereof. For this reason, the compressed symbol array represents a value represented by the following Equation (7).

At this time, a symbol of the compressed symbol array corresponding to an output of the linear digital filter is generated at a timing that is delayed by $\{(u-1)/2\}T$ from an operation timing that is a timing at which an operation is performed for an m-value electrical information symbol array $\{r_t\}$ output by the optical receiver 32.

Here, u is the number of taps of the linear digital filter. $C_1, C_2, \ldots, C_u$ are tap gains of the linear digital filter. In Equation (7), j represents an integer in the range of 1 to u.

[Math. 7]

$$OutA = \sum_{j=1}^{u} C_j r_{t-\frac{u+1}{2}+j} \qquad (7)$$

Values of the tap gains $C_1, C_2, \ldots, C_u$ are values that may be updated in the process of the identifying circuit 4 performing symbol determination. Hereinafter, in a case in which the tap gains $C_1, C_2, \ldots, C_u$ do not need to be identified from each other, one thereof will be referred to as a tap gain C.

The transmission line shortening unit 41 may be any arbitrary circuit as long as it is a circuit that can perform a compression process and, for example, may be a finite impulse response (FIR) filter.

Figure 6:
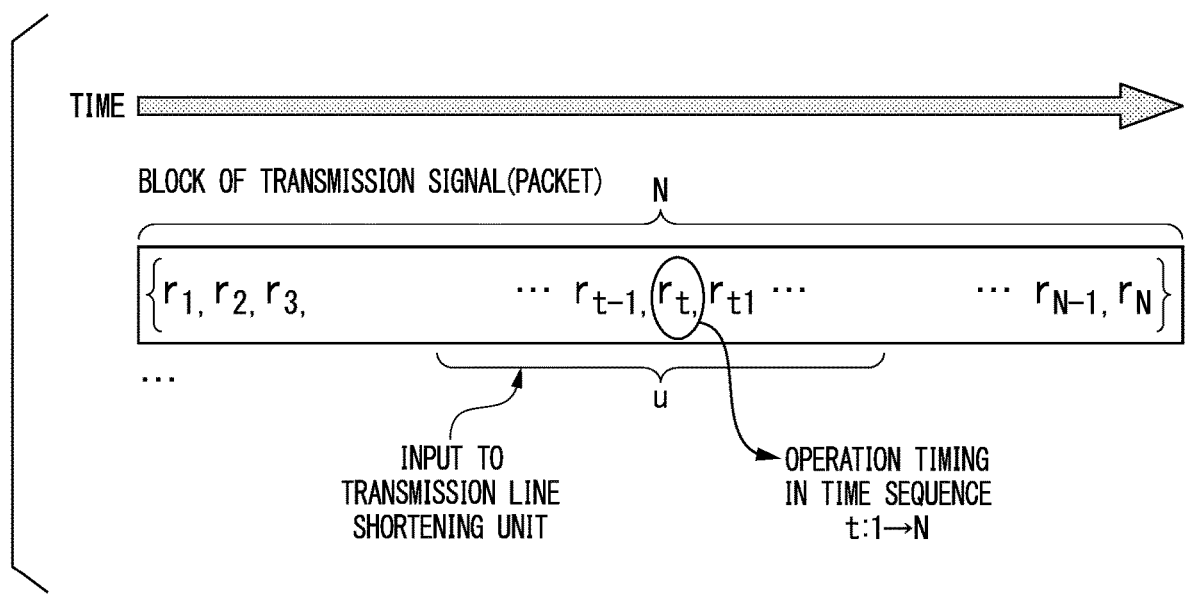
FIG. 6 is an explanatory diagram illustrating a partial symbol array according to the first embodiment.

FIG. 6 is an explanatory diagram illustrating a partial symbol array according to the first embodiment. u symbols in a symbol array of which a sequence length is N are input to the transmission line shortening unit.

The first transmission line estimating unit 42 acquires a function represented by a Volterra series having a predetermined Volterra kernel as an estimated transfer function H' on the basis of the transmission line state µt at the time t. The first transmission line estimating unit 42 includes an adaptive nonlinear digital filter. The adaptive nonlinear digital filter included in the first transmission line estimating unit 42 is a Volterra filter of the second order. The Volterra filter is not necessarily a filter of the second order and may be a Volterra filter of an order higher than the second order.

The estimated transfer function H' output by the first transmission line estimating unit 42 is represented by the following Equation (8).

[Math. 8]

$$H'(s'_{t-v+1}, \ldots, s'_t, s'_{t-v+1}s'_{t-v+1}, \ldots, s'_t s'_t) = \qquad (8)$$
$$\sum_{j=1}^{v} h_j s'_{t-v+j} + \sum_{j=1}^{v} \sum_{k=1}^{v} h_{jk} s'_{t-v+j} s'_{t-v+k}$$

Here, v is a storage length of the nonlinear digital filter. In addition, $h_1, h_2, \ldots, h_v, h_{11}, h_{12}, \ldots, h_{vv}$ are Volterra kernels (in other words, coefficients) of the Volterra series of the second order of the first transmission line estimating unit 42. The Volterra kernels of the first transmission line estimating unit 42 have values that may be updated in the process of the identifying circuit 4 performing symbol determination. In addition, $s'_{t-v+1}, \ldots, s'_t$ is an information symbol array propagating through the transmission line 3 in the transmission line 3 state $\mu_t=(s'_{t-v+1}, \ldots, s'_t, \ldots, s'_t)$ at the time t. Hereinafter, $(s'_{t-v+1}, \ldots, s'_t, s'_{t-v+1}s'_{t-v+1}, s'_{t-v+1}s'_{t-v+2}, \ldots, s'_t s'_t)$ in Equation (8) will be referred to as input elements.

In a case in which an adaptive nonlinear digital filter is used in the transmission line shortening unit 41, a nonlinear operation is repeatedly performed for an information symbol array passing through a nonlinear transfer function, and accordingly, there is a possibility that a high-order component is generated. In addition, since a nonlinear operation is performed for the information symbol array in the sequential operation, the amount of calculation increases exponentially.

On the other hand, in a case in which an adaptive nonlinear digital filter is used in the transmission line estimating unit, since a nonlinear operation is performed for the state $\mu=(s'_{t-v+1}, \ldots, s'_t)$ of the transmission line at the time t, there is no concern that excessive high-order components are generated. In addition, since the input elements $(s'_{t-v+1}, \ldots, s'_t, s'_{t-v+1}s'_{t-v+1}, s'_{t-v+1}s'_{t-v+2}, \ldots, s'_t s'_t)$ for the first transmission line estimating unit 42 including a second-order item are invariable, an operation of the second order in the adaptive nonlinear digital filter becomes only the preparation of the input elements, and thus, the amount of calculation can be sequentially reduced.

By using the adaptive nonlinear filter, although the identification accuracy of the identifying circuit 4 is improved, there is a large difference between the numbers of taps required for acquiring sufficient performance in the transmission line shortening unit 41 and the first transmission line estimating unit 42. More specifically, for example, the number of required taps is several tens of taps in the transmission line shortening unit 41 and is several taps in the first transmission line estimating unit 42. For this reason, there is a large difference between the increased amounts of operations when a filter used in each unit is an adaptive nonlinear filter. Accordingly, an increase in the total amount of operation can be inhibited more in a case in which an adaptive nonlinear filter is used in the first transmission line estimating unit 42 than in a case in which an adaptive nonlinear filter is used in the transmission line shortening unit 41.

The addition comparison selection processing unit 43 calculates a metric b using the following Equation (9) on the basis of an output of the transmission line shortening unit 41 and an output of the first transmission line estimating unit 42. In addition, the addition comparison selection processing unit 43 calculates $d\_min_t(\mu_t)$ on the basis of the calculated metric b and Equations (4) to (6).

[Math. 9]

$$b(r_t; \mu_{t-1} \to \mu_t) = \left| \sum_{j=1}^{u} c_j r_{t-\frac{u+1}{2}+j} - \left( \sum_{j=1}^{v} h_j s'_{t-v+j} + \sum_{j=1}^{v} \sum_{k=1}^{v} h_{jk} s'_{t-v+j} s'_{t-v+k} \right) \right|^2 \quad (9)$$

The path tracing-back determination unit 44 selects a transmission line state that becomes a start point of a trellis path of the Viterbi algorithm in which a distance function for reaching the transmission line state $\mu_t$ at the time t becomes d_min$_t(\mu_t)$. The path tracing-back determination unit 44 calculates an estimated value of each symbol of the m-value electrical information symbol array $\{s_t\}$ on the basis of the selected transmission line state. Hereinafter, an estimated value of each symbol of the m-value electrical information symbol array $\{s_t\}$ will be denoted by $A_t$, and a symbol array acquired by replacing a value of each symbol of the m-value electrical information symbol array $\{s_t\}$ with the estimated value $A_t$ will be referred to as an estimated symbol array $\{A_t\}$.

It is known that the trellis path of the Viterbi algorithm converges when tracing back about several times the storage length of the first transmission line estimating unit 42. In addition, by setting the number of the transmission line states tracing back (hereinafter, referred to as the tracing-back number") to a fixed value, an increase in the amount of calculation in the process of symbol determination can be inhibited.

The second transmission line estimating unit 45 includes the same adaptive nonlinear digital filter as that of the first transmission line estimating unit 42 and calculates values used for updating values of the Volterra kernels of the first transmission line estimating unit 42. The second transmission line estimating unit 45 acquires an estimated symbol array $\{A_t\}$ that has been delayed by a time (v−1)T and calculates a function H" (hereinafter, referred to as an "updating function H'"") represented in the following Equation (10) instead of calculating the estimated transfer function H' using Equation (8).

[Math. 10]

$$H''(A_{t-v+1}, \ldots, A_t, A_{t-v+1}A_{t-v+1}, \ldots, A_t A_t) = \sum_{j=1}^{v} h'_j A_{t-v+j} + \sum_{j=1}^{v} \sum_{k=1}^{v} h'_{jk} A_{t-v+j} A_{t-v+k} \quad (10)$$

Here, $h'_1, h'_2, \ldots, h'_v, h'_{11}, h'_{12}, h'_{vv}$, are Volterra kernels (in other words, coefficients) of the second-order Volterra series of the second transmission line estimating unit 45. The Volterra kernels of the second transmission line estimating unit 45 are values that can be updated in the process of the identifying circuit 4 performing symbol determination.

The delay generating unit 46 delays the compressed symbol array input to a filter updating algorithm unit by a time wT. Here, w is the tracing-back number.

The filter update algorithm unit 47 acquires the compressed symbol array, the estimated symbol array $\{A_t\}$, and the updating function H" and updates the value of the tap gain C of the transmission line shortening unit 41, the values of the Volterra kernels of the first transmission line estimating unit 42, and the values of the Volterra kernels of the second transmission line estimating unit 45.

The filter update algorithm unit 47 updates the values of the tap gains C of the transmission line shortening unit 41 using a difference (hereinafter, referred to as a "tap gain updating evaluation value") between the symbol array acquired by delaying the compressed symbol array by the time wT and the estimated symbol array $\{A_t\}$. When updating is performed, an algorithm of an iterative approximate analysis such as a recursive least square (RLS) algorithm or a least mean square (LMS) algorithm is used.

The estimated symbol array $\{A_t\}$ used for updating the tap gains C is a symbol array delayed by the time wT in accordance with a delay occurring when determination according to the path tracing-back is performed. When the tap gains C are updated by the filter update algorithm unit 47, it is necessary that input timings of the compressed symbol array and the estimated symbol array $\{A_t\}$ for the filter update algorithm unit 47 be the same.

For this reason, the filter update algorithm unit 47 uses the compressed symbol array delayed by the time wT when updating the values of the tap gains C.

The filter update algorithm unit 47 updates the values of the Volterra kernels of the first transmission line estimating unit 42 and the values of the Volterra kernels of the second transmission line estimating unit 45 using a difference (hereinafter, referred to as Volterra kernel updating evaluation values) between the output of the updating function H" when the estimated symbol array $\{A_t\}$ is set as an input and the symbol array acquired by delaying the compressed symbol array by the time wT. The values of the Volterra kernels of the first transmission line estimating unit 42 after update and the values of the Volterra kernels of the second transmission line estimating unit 45 are the same.

When updating is performed, an algorithm of an iterative approximate analysis such as an RLS algorithm or an LMS algorithm is used.

In updating the values of the Volterra kernels of the first transmission line estimating unit 42 and the values of the Volterra kernels of the second transmission line estimating unit 45 (hereinafter, referred to as "Volterra kernel updating"), it is necessary that input timings of the compressed symbol array and the output of the updating function H" for the filter update algorithm unit 47 be the same. The estimated symbol array $\{A_t\}$ used for Volterra kernel updating is, as described above, a symbol array delayed by the time wT in accordance with a delay occurring at the time of determination according to path tracing-back. For this reason, when the updating function H" is calculated by the second transmission line estimating unit 45, by using the estimated symbol array $\{A_t\}$ delayed by a time (v−1)T, the input timings of the compressed symbol array and the output of the updating function H" for the filter update algorithm unit 47 become the same when Volterra kernel updating is performed by the filter update algorithm unit 47.

Figure 7:
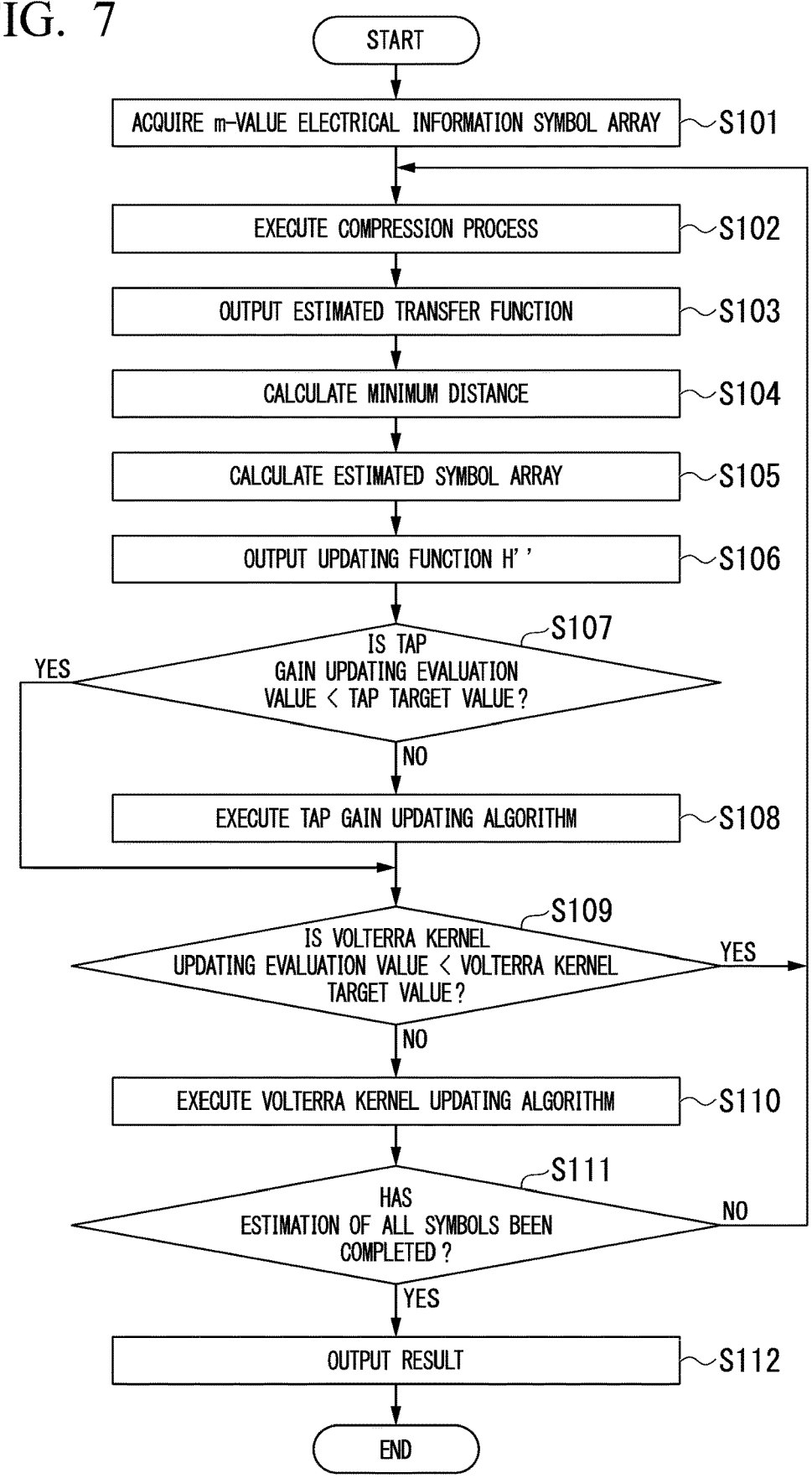
FIG. 7 is a flowchart illustrating the flow of a specific process of symbol determination that is performed by the identifying circuit 4 according to the first embodiment.

FIG. 7 is a flowchart illustrating the flow of a specific process of symbol determination that is performed by the identifying circuit 4 according to the first embodiment.

The identifying circuit 4 acquires an m-value electrical information symbol array (Step S101). The transmission line shortening unit 41 executes a compression process for a partial symbol array of the m-value electrical information symbol array acquired in Step S101 and outputs a compressed symbol array (Step S102). The first transmission line estimating unit 42 calculates an estimated transfer function H' on the basis of the transmission line state $\mu_t$ at the time t (Step S103). The addition comparison selection processing unit 43 calculates a metric b on the basis of the compressed symbol array and the estimated transfer function H' output in Steps S102 and S103. In addition, the addition comparison selection processing unit 43 calculates a minimum distance $d\_min_t(\mu_t)$ (Step S104). The path tracing-back determination unit 44 calculates an estimated symbol array $\{A_t\}$ using the Viterbi algorithm on the basis of the minimum distance $d\_min_t(\mu_t)$ (Step S105).

The second transmission line estimating unit 45 calculates an output of the updating function H" when the estimated symbol array $\{A_t\}$ is set as an input (Step S106). The filter update algorithm unit 47 determines whether or not a tap gain updating evaluation value that is a difference between the symbol array acquired by delaying the compressed symbol array by the time wT and the output of the second transmission line estimating unit 45 when the estimated symbol array $\{A_t\}$ is set as an input is larger than a predetermined value (tap target value) set in advance (Step S107).

In a case in which the tap gain updating evaluation value is equal to or larger than a tap target value (Step S107: No), the filter update algorithm unit 47 changes the value of the tap gain by an amount of change based on the tap gain updating evaluation value (Step S108). Next, the filter update algorithm unit 47 determines whether or not a Volterra kernel updating evaluation value that is a difference between the output of the updating function H" at the time of setting the estimated symbol array $\{A_t\}$ as an input and the symbol array acquired by delaying the compressed symbol array by the time wT is larger than a predetermined value (a Volterra target value) set in advance (Step S109). In a case in which the Volterra kernel updating evaluation value is smaller than the Volterra target value (Step S109: Yes), the process is returned to Step S102. On the other hand, in a case in which the Volterra kernel updating evaluation value is equal to or larger than the Volterra target value (Step S109: No), the filter update algorithm unit 47 changes the value of the Volterra kernel by an amount of change based on the Volterra kernel updating evaluation value (Step S110).

In a case in which the estimation of all the symbols has been completed in the process of Step S110 (Step S111: Yes), the identifying circuit 4 outputs the estimated symbol array $\{A_t\}$ acquired in Step S105 as a result of the estimation (Step S112).

On the other hand, in a case in which the estimation of all the symbols has not been completed in the process of Step S111 (Step S111: No), the process returns to the process of Step S102.

On the other hand, in a case in which the tap gain updating evaluation value is smaller than the tap target value in Step S107 (Step S107: Yes), the process of Step S108 is omitted, and Step S109 is executed.

Figure 8:
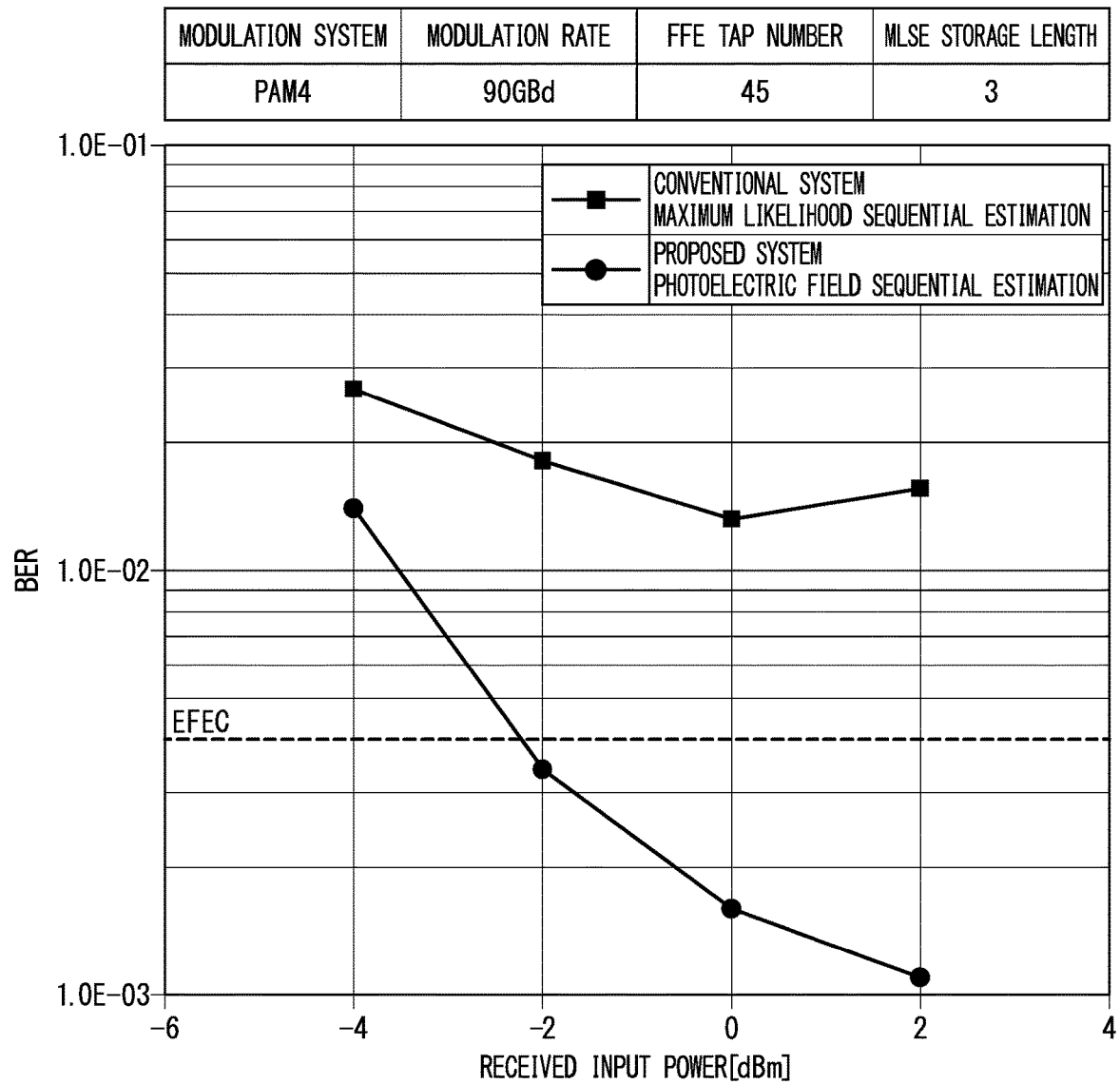
FIG. 8 is a diagram illustrating a test result of symbol determination using the identifying circuit 4 according to the first embodiment and a test result of symbol determination using the conventional identifying circuit 8.

FIG. 8 is a diagram illustrating a test result of symbol determination using the identifying circuit 4 according to the first embodiment and a test result of symbol determination using a conventional identifying circuit 8.

In the test results illustrated in FIG. 8, the horizontal axis represents a bit error rate (BER), and the horizontal axis represents input power of light transmitting information symbols to the identifying circuit 4 or the identifying circuit 8. FIG. 8 illustrates that the BER rate is low in the symbol determination using the identifying circuit 4 according to the embodiment.

The identifying circuit 4 according to the embodiment configured in this way includes the transmission line shortening unit 41 that compress part of the input and the first transmission line estimating unit 42 that estimates a transfer function in accordance with Volterra series expansion, and accordingly, a symbol determination method using MLSE inhibiting an increase in the amount of calculation can be provided.

Second Embodiment

Figure 9:
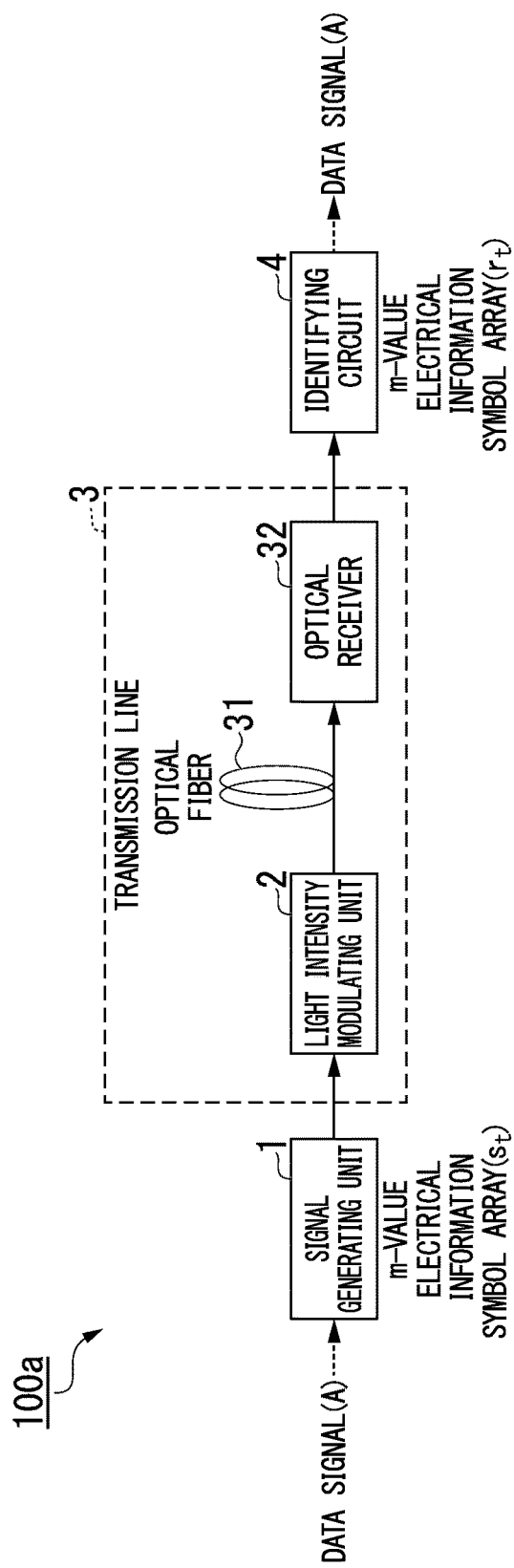
FIG. 9 is a diagram illustrating a specific system configuration of a communication system 100a according to a second embodiment.

FIG. 9 is a diagram illustrating a specific system configuration of a communication system 100*a* according to a second embodiment. The communication system 100*a* includes an identifying circuit 4*a* instead of the identifying circuit 4, which is different from the communication system 100. Hereinafter, the same reference signs as those illustrated in FIG. 1 are assigned to units having the same functions, and description thereof will be omitted.

The identifying circuit 4*a*, similar to the identifying circuit 4, acquires an m-value electrical information symbol array $\{r_t\}$ and performs symbol determination of acquiring an estimated value of each symbol of the m-value electrical information symbol array $\{s_t\}$.

Figure 10:
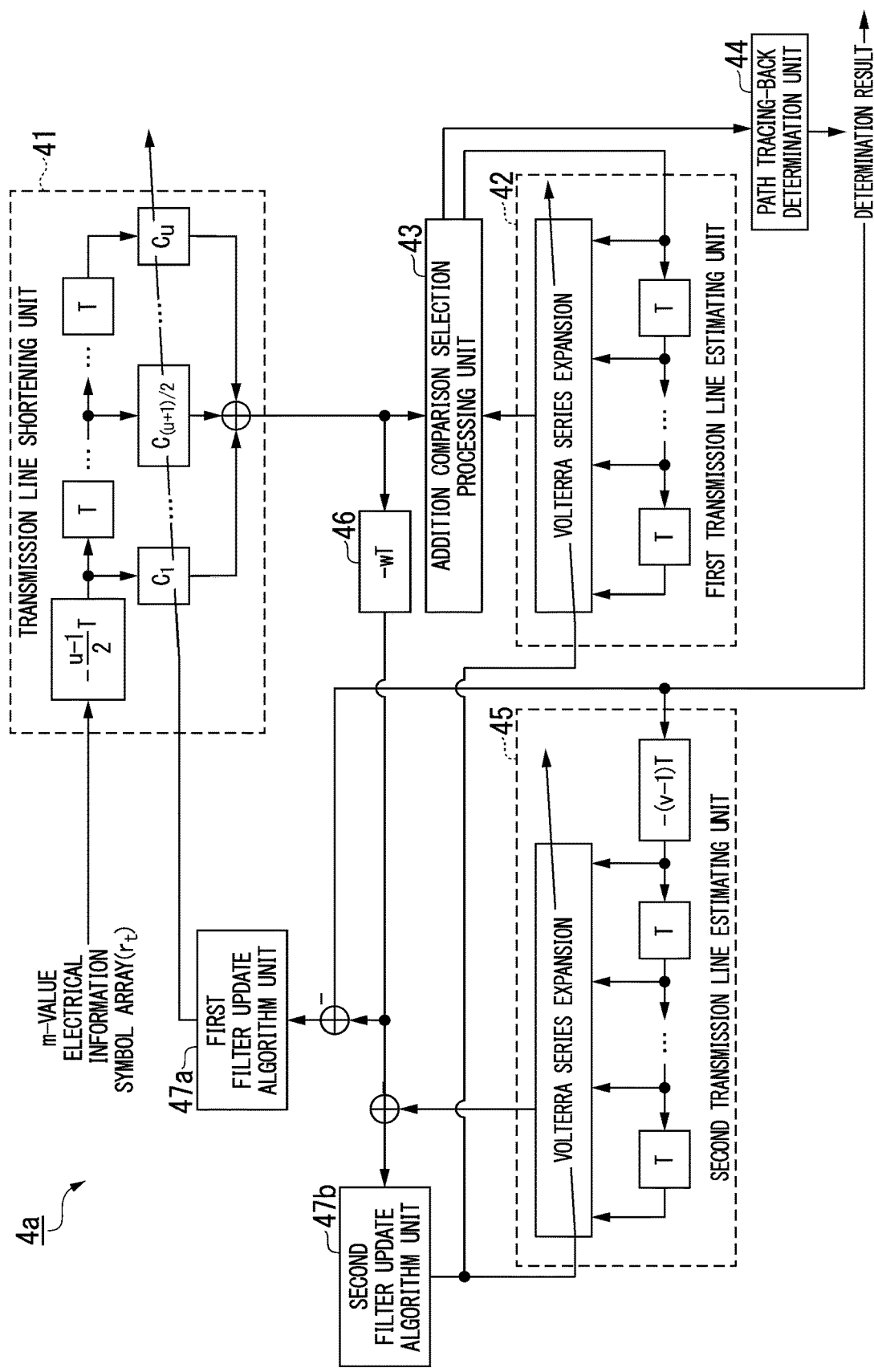
FIG. 10 is a diagram illustrating a specific example of the functional configuration of an identifying circuit 4a according to the second embodiment.

FIG. 10 is a diagram illustrating a specific example of the functional configuration of the identifying circuit 4*a* according to the second embodiment. The identifying circuit 4*a* includes a first filter update algorithm unit 47*a* (filter updating unit) and a second filter update algorithm unit 47*b* (filter updating unit) instead of the filter update algorithm unit 47, which is different from the identifying circuit 4. Hereinafter, the same reference signs as those illustrated in FIG. 5 are assigned to units having the same functions, and description thereof will be omitted.

The first filter update algorithm unit 47*a* updates the values of the tap gains C of the transmission line shortening unit 41 using a difference (hereinafter, referred to as a "tap gain updating evaluation value") between the symbol array acquired by delaying a compressed symbol array by a time wT and an estimated symbol array $\{A_t\}$. When updating is performed, an algorithm of an iterative approximate analysis such as a recursive least square (RLS) algorithm or a least mean square (LMS) algorithm is used.

The estimated symbol array $\{A_t\}$ used for updating the tap gains C is a symbol array delayed by the time wT in accordance with a delay occurring when determination according to the path tracing-back is performed. When the tap gains C are updated by the first filter update algorithm unit 47*a*, it is necessary that input timings of the compressed symbol array and the estimated symbol array $\{A_t\}$ for the first filter update algorithm unit 47*a* be the same. For this reason, the first filter update algorithm unit 47*a* uses the compressed symbol array delayed by the time wT when updating the values of the tap gains C.

The second filter update algorithm unit 47*b* updates the values of the Volterra kernels of the first transmission line estimating unit 42 and the values of the Volterra kernels of the second transmission line estimating unit 45 using a difference (in other words, Volterra kernel updating evaluation values) between the symbol array acquired by delaying the compressed symbol array by the time wT and the output of the second transmission line estimating unit 45 when the estimated symbol array $\{A_t\}$ is set as an input. The values of the Volterra kernels of the first transmission line estimating unit 42 after update and the values of the Volterra kernels of the second transmission line estimating unit 45 are the same. When updating is performed, an algorithm of an iterative approximate analysis such as an RLS algorithm or an LMS algorithm is used.

In updating the values of the Volterra kernels of the first transmission line estimating unit 42 and the values of the Volterra kernels of the second transmission line estimating unit 45 (in other words, "Volterra kernel updating"), it is necessary that input timings of the output of the updating function H" and the estimated symbol array {$A_t$} for the second filter update algorithm unit 47b be the same. The estimated symbol array {$A_t$} used for Volterra kernel updating is, as described above, a symbol array delayed by the time wT in accordance with a delay occurring at the time of determination according to path tracing-back. For this reason, when the updating function H" is calculated by the second transmission line estimating unit 45, by using the estimated symbol array {$A_t$} delayed by a time (v−1)T, the input timings of the output of the updating function H" and the estimated symbol array {$A_t$} for the second filter update algorithm unit 47b become the same when Volterra kernel updating is performed by the second filter update algorithm unit 47b.

Modified Example

In addition, in the communication system 100 according to the first embodiment and the communication system 100a according to the second embodiment, by configuring the transmission line shortening unit 41 and the first transmission line estimating unit 42 as adaptive digital filters, symbol determination using blind estimation without requiring prior tap gain training can be performed. In such a case, in order to normally operate the adaptive digital filter, it is necessary that the tap coefficients and the Volterra kernel be accurately performed.

In addition, as a characteristic of an optical transmission line, variation speeds of factors of wavelength distortion (a band limit and a wave dispersion) are very slow. For this reason, as superiority of photoelectric field sequential estimation, by configuring the transmission line shortening unit 41 and the first transmission line estimating unit 42 as adaptive digital filters and performing tap gain training in advance, the amount of calculation can be reduced to a large extent in the symbol determining process of the communication system 100 owing to no sequential update of tap coefficients and Volterra kernels.

Figure 11:
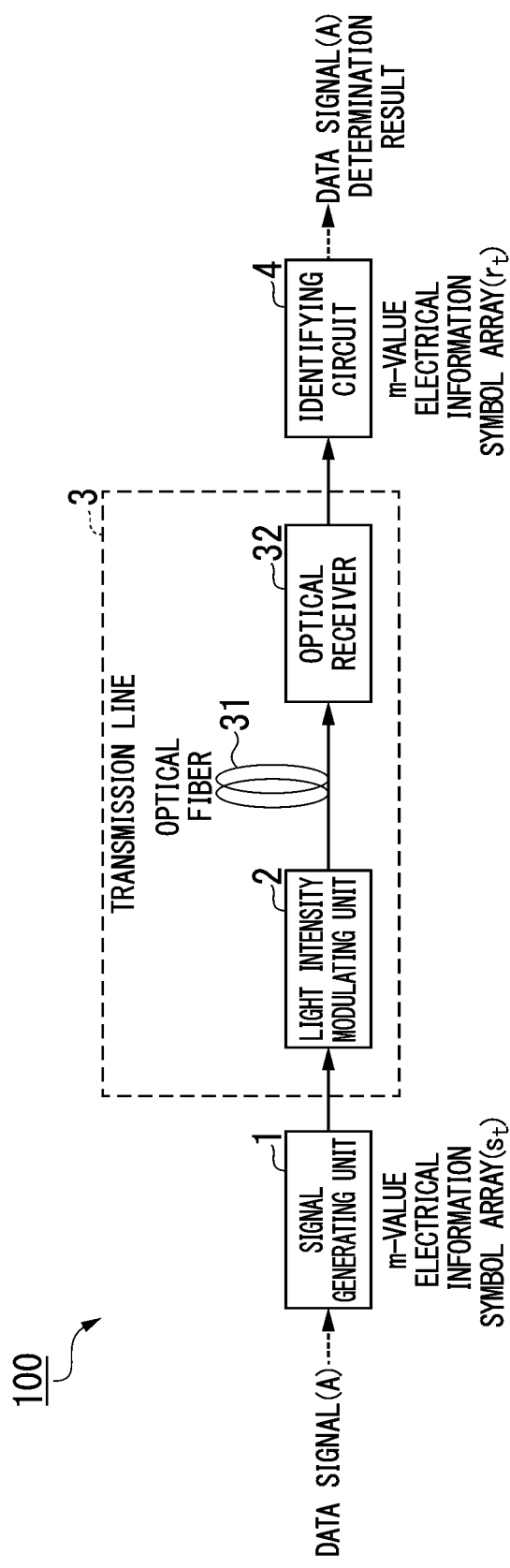
FIG. 11 is an explanatory diagram of a communication system 100 in a case in which prior tap gain training is performed.
Figure 12:
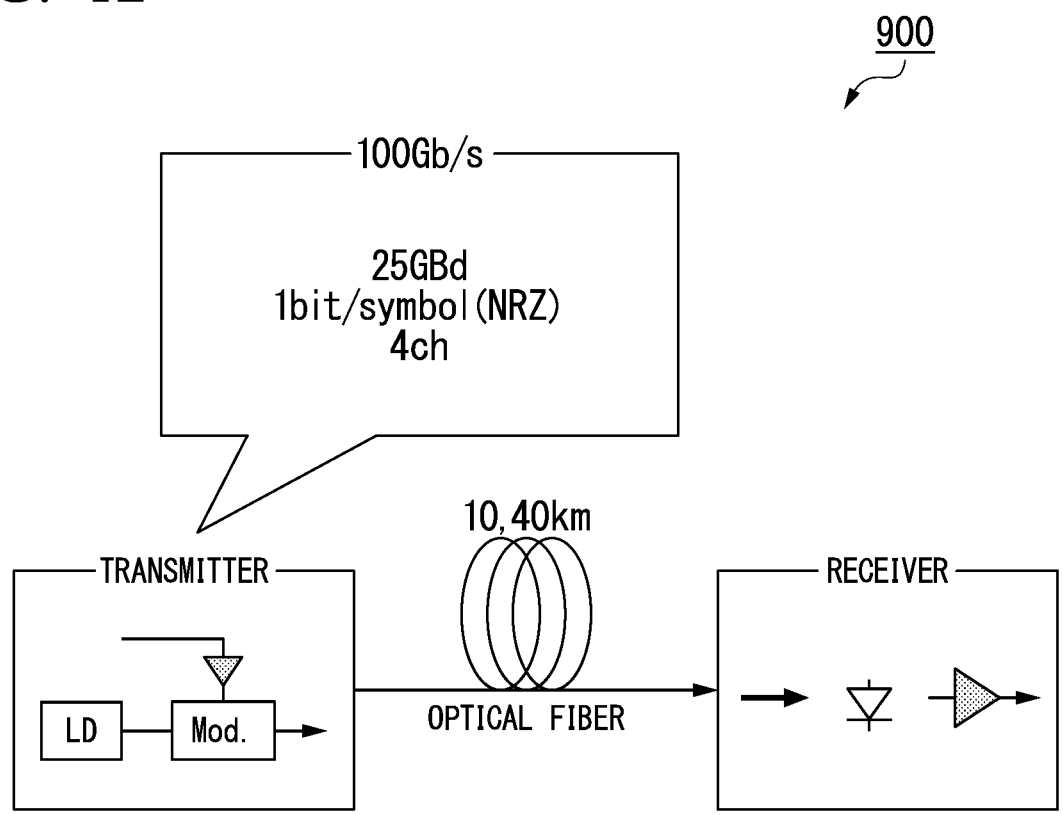
FIG. 12 is an explanatory diagram illustrating communication according to current Ethernet specifications.

In the prior tap gain training, a known random symbol sequence is required. FIG. 11 is an explanatory diagram of a communication system 100 in a case in which prior tap gain training is performed. In FIG. 11, as a training information symbol array A', a symbol array acquired by converting an information bit row in which a pseudo random binary sequence (PRBS) is repeated into an m-value electrical information symbol array is used. A training information symbol array A' is transmitted, and an information symbol array A acquired by determining a received m-value electrical signal sequence {$r_t$} using an identifying circuit is considered to deviate from a start point of the information symbol array A' according to the received timing (offset). The identifying circuit at this time does not require high accuracy, and accordingly, the identifying circuit according to the first embodiment or the second embodiment does not need to be used. Thus, a correlation between the information symbol array A and the information symbol array A' is taken, the training information symbol array A1 with the offset taken into account is transmitted again, and the adaptive digital filter of the identifying circuit is updated using the training information symbol array A' instead of the information symbol array A that is a result of the determination. In this way, update and convergence of tap coefficients and Volterra kernels on which a correct determination result is reflected can be performed.

In addition, when variations in the optical transmission line are considered, in a case in which a minimum value at the time of calculating the metric b exceeds a predetermined threshold, the tap gain C of the transmission line shortening unit 41 and the Volterra kernel of the first transmission line estimating unit 42 are updated. Since the likelihood of the result of determination of the sequential estimation becomes higher as the metric b decreases, the magnitude of the metric b closely relates to the accuracy of the sequential estimation. When the threshold is small, the adaptive digital filter follows even a fine variation of the transmission line. On the other hand, in a case in which the threshold is large, an update is not performed even when the transmission lines vary to a certain degree. For this reason, in accordance with the magnitude of this threshold, trade-off between the amount of calculation for updating the filter and the accuracy of the sequential estimation can be adjusted. When this technique is used, comparison of the metric b is performed in addition to the path metric in the Viterbi algorithm Thus, although the amount of calculation increases more than in a case in which the variations in the optical transmission line are not taken into account, a stable operation against the variations in the optical transmission line can be realized. In addition, this technique is a technique that is effective for reducing the amount of calculation also in a case in which the prior tap gain training described above is not performed.

In a case in which an increase in the amount of calculation according to the comparison of the metric b described above is avoided, by setting the value of a predetermined X as a timing for filter updating such that the filter updating is performed once every time when a symbol representing the value of the predetermined X is received, the filter updating frequency is decreased, whereby the amount of calculation can be reduced. This technique is a technique that is also effective for reducing the amount of calculation also in a case in which the prior tap gain training is not performed.

In a case in which symbol determination using blind estimation is performed, more specifically, the value of the tap gain and the values of the Volterra kernels are updated on the basis of a difference between a first symbol array and a second symbol array. The first symbol array is a compressed symbol array output by the transmission line shortening unit 41 in a case in which the training information symbol array A' propagates as a transmission signal, and the symbol array acquired by the transmission line shortening unit 41 is input. The second symbol array is an output of the second transmission line estimating unit 45 in a case in which the training information symbol array A' is input.

In addition, the tap gain updating evaluation value may be a difference between a symbol array acquired by delaying the compressed symbol array by a time wT and an output of the second transmission line estimating unit 45 when the estimated symbol array {$A_t$} is set as an input.

In addition, the first filter update algorithm unit 47a may determine whether or not the tap gain of the linear digital filter is to be updated by performing comparison with a predetermined value by referring to the value of the distance function.

In addition, the Volterra kernel updating evaluation value may be a difference between a symbol array acquired by delaying the compressed symbol array by the time wT and an output of the second transmission line estimating unit 45 when the estimated symbol array {$A_t$} is set as an input.

In addition, the second filter update algorithm unit 47b may determine whether or not the values of Volterra kernels are to be updated by performing comparison with a predetermined value by referring to the value of the distance function. The second filter update algorithm unit 47b may be configured integrally with the first filter update algorithm unit 47a.

The first transmission line estimating unit 42 is an example of a transmission line estimating unit.

The identifying circuits 4 and 4a according to the embodiments described above may be configured to realized using a computer. In such a case, by recording a program for realizing this function in a computer-readable recording medium and causing a computer system to read and execute the program recorded in this recording medium, the function may be realized. The "computer system" described here includes an operating system (OS) and hardware such as peripherals. Furthermore, the "computer-readable recording medium" represents a portable medium such as a flexible disk, a magneto-optical disk, a ROM, or a CD-ROM or a storage device such as a hard disk built into the computer system. In addition, the "computer-readable recording medium" may include a medium dynamically storing the program for a short time such as a communication line in a case in which the program is transmitted via a network such as the Internet or a communication line such as a telephone line and a medium storing the program for a predetermined time such as a volatile memory inside a computer system serving as a server or a client in the case. In addition, the program described above may be used for realizing some of the functions described above, may realize the function described above in combination with a program that has already been recorded in a computer system, or may realize the function using a programmable logic device such as a field programmable gate array (FPGA).

As above, while the embodiments of the present invention have been described in detail with reference to the drawings, a specific configuration is not limited to these embodiments, and the present invention includes a design and the like in a range not departing from the concept of the present invention.

REFERENCE SIGNS LIST

1 Signal generating unit
2 Light intensity modulating unit
3 Transmission line
4 Identifying circuit
31 Optical fiber
32 Optical receiver
41 Transmission line shortening unit
42 First transmission line estimating unit
43 Addition comparison selection processing unit
44 Path tracing-back determination unit
45 Second transmission line estimating unit
46 Delay generating unit
47 Filter update algorithm unit
4a Identifying circuit
47a First filter update algorithm unit
47b Second filter update algorithm unit

The invention claimed is:

1. A symbol-determining device comprising:
a transmission line symbol compressing unit that acquires part of an input signal formed from a symbol array propagating through a transmission line, for each symbol of the acquired symbol array, calculates a value acquired by multiplying a value represented by the symbol by a tap gain of a linear digital filter, calculates a sum of values acquired through the multiplication, and outputs a symbol array representing the sum;
a first transmission line estimating unit that includes an adaptive nonlinear digital filter and estimates a transfer function of the transmission line using the adaptive nonlinear digital filter on the basis of a symbol array representing a state of the transmission line;
an addition comparison processing unit that calculates a minimum value of a distance function on the basis of a metric that is a value calculated on the basis of the output of the transmission line symbol compressing unit and the transfer function estimated by the first transmission line estimating unit; and
a determination unit that performs symbol determination on the basis of the minimum value of the distance function and outputs a symbol array that is a result of the determination.

2. The symbol-determining device according to claim 1, further comprising a filter updating unit that updates a value of the tap gain on the basis of the symbol array representing the sum output by the transmission line symbol compressing unit and the symbol array output by the determination unit.

3. The symbol-determining device according to claim 2, wherein the adaptive nonlinear digital filter included in the first transmission line estimating unit is a Volterra filter of an n-th order where n is an integer equal to or larger than two.

4. The symbol-determining device according to claim 3, wherein the filter updating unit updates a value of a Volterra kernel on the basis of a value of a Volterra kernel of the first transmission line estimating unit and the symbol array output by the determination unit.

5. The symbol-determining device according to claim 3, wherein the value of the tap gain and a value of a Volterra kernel of the Volterra filter are acquired through training performed in advance.

6. The symbol-determining device according to claim 4, further comprising a second transmission line estimating unit that includes the adaptive nonlinear digital filter and calculates a value used for updating a value of a Volterra kernel of the first transmission line estimating unit,
wherein the value of the tap gain and the value of the Volterra kernel are updated on the basis of a difference between the symbol array representing the sum in a case in which a training information symbol array generated on the basis of a known information bit row propagates as a transmission signal and in a case in which the symbol array acquired by the transmission line compressing unit is input and the output of the second transmission line estimating unit in a case in which the training information symbol array is input.

7. The symbol-determining device according to claim 2, wherein the filter updating unit determines whether or not the tap gain of the linear digital filter is to be updated by performing comparison with a predetermined value by referring to the value of the distance function.

8. The symbol-determining device according to claim 4, wherein the filter updating unit determines whether or not the value of the Volterra kernel is to be updated by performing comparison with a predetermined value by referring to the value of the distance function.

9. The symbol-determining device according to claim 1,
wherein the addition comparison processing unit calculates the minimum value of the distance function using a Viterbi algorithm, and
wherein the determination unit performs symbol determination by tracing back a trellis path in the Viterbi algorithm.

10. A symbol determination method comprising:

a transmission line symbol compressing of acquiring part of an input signal formed from a symbol array propagating through a transmission line, for each symbol of the acquired symbol array, calculating a value acquired by multiplying a value represented by the symbol by a tap gain of a linear digital filter, calculating a sum of values acquired through the multiplication, and outputting a symbol array representing the sum;

a first transmission line estimating of including an adaptive nonlinear digital filter and estimating a transfer function of the transmission line using the adaptive nonlinear digital filter on the basis of a symbol array representing a state of the transmission line;

an addition comparison processing of calculating a minimum value of a distance function on the basis of a metric that is a value calculated on the basis of the output in the transmission line shortening step symbol compressing and the transfer function estimated in the first transmission line estimating; and a determination of performing symbol determination on the basis of the minimum value of the distance function and outputting a symbol array that is a result of the determination.

\* \* \* \* \*